(12) United States Patent
Chang et al.

(10) Patent No.: US 11,551,889 B2
(45) Date of Patent: Jan. 10, 2023

(54) KEY SWITCH

(71) Applicant: DARFON ELECTRONICS CORP., Taoyuan (TW)

(72) Inventors: Yu-Chih Chang, Taoyuan (TW); Chin-Lung Chan, Taoyuan (TW); Cheng-Min Su, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 380 days.

(21) Appl. No.: 16/745,279

(22) Filed: Jan. 16, 2020

(65) Prior Publication Data

US 2020/0411257 A1 Dec. 31, 2020

(30) Foreign Application Priority Data

Jun. 25, 2019 (TW) ................... 108122083

(51) Int. Cl.
| | |
|---|---|
| *H01H 13/52* | (2006.01) |
| *H03K 17/94* | (2006.01) |
| *H01H 13/20* | (2006.01) |
| *H01H 13/14* | (2006.01) |

(52) U.S. Cl.
CPC .......... *H01H 13/52* (2013.01); *H01H 13/14* (2013.01); *H01H 13/20* (2013.01); *H03K 17/941* (2013.01); *H01H 2013/525* (2013.01); *H01H 2215/006* (2013.01)

(58) Field of Classification Search
CPC ........ H01H 13/52; H01H 13/14; H01H 13/20; H01H 2013/525; H01H 2215/006; H01H 2235/01; H01H 2237/00; H01H 3/125; H01H 13/85; H01H 13/7065; H01H 3/122; H01H 13/705; H03K 17/941; H03K 17/969; H03K 17/94
See application file for complete search history.

(56) References Cited

U.S. PATENT DOCUMENTS

| | | | |
|---|---|---|---|
| 11,257,635 B2* | 2/2022 | Ruff | ................. H01H 3/125 |
| 2001/0007301 A1* | 7/2001 | Sato | ................. H01H 3/122 |
| | | | 200/344 |
| 2018/0107284 A1 | 4/2018 | Hou | |

(Continued)

FOREIGN PATENT DOCUMENTS

| | | |
|---|---|---|
| CN | 100468276 C | 3/2009 |
| CN | 100474475 C | 4/2009 |
| CN | 100481294 C | 4/2009 |

(Continued)

*Primary Examiner* — Lheiren Mae A Caroc
(74) *Attorney, Agent, or Firm* — Winston Hsu

(57) ABSTRACT

A key switch is provided, which includes a base, a cap, a first linkage rod, a second linkage rod, an elastic contraction element, at least one activate member and a thin film circuit unit. The base includes a plurality of first connection portions and a plurality of second connection portions. The first linkage rod is movably connected to the first connection portions and the cap. The second linkage rod is movably connected to the second connection portions and the cap. One end of the elastic contraction element is connected to the first linkage rod, and the other end thereof is connected to the second linkage rod. The activate member is disposed on one of the first linkage rod, the second linkage rod and the cap. The thin film circuit unit includes an activate portion.

17 Claims, 20 Drawing Sheets

(56) References Cited

U.S. PATENT DOCUMENTS

2021/0225601 A1\* 7/2021 Wu ........................ H01H 13/10

FOREIGN PATENT DOCUMENTS

| | | |
|---|---|---|
| CN | 202025292 U | 11/2011 |
| CN | 104299828 A | 1/2015 |
| CN | 105070565 A | 11/2015 |
| CN | 207116249 U | 3/2018 |
| CN | 104715953 B | 4/2018 |
| CN | 108962654 A | 12/2018 |

\* cited by examiner

KEY SWITCH

BACKGROUND OF THE INVENTION

1. Field of the Invention

The present invention relates to a key switch, and more specifically, to a key switch having a simplified structure.

2. Description of the Prior Art

A conventional key switch includes a signal generating unit, a linkage rod, a feedback mechanism, and so on. Since the signal generating unit, the linkage rod and a feedback mechanism are large-sized, it is hard to reduce the overall volume of the key switch so as to be disadvantageous to the thinning design of the key switch. Furthermore, for providing a better signal emitting effect and an obvious tactile feedback, the signal generating unit and the feedback mechanism cannot be omitted or replaced.

SUMMARY OF THE INVENTION

An embodiment of the present invention provides a key switch to solve the prior art problem. The key switch includes a base, a cap, a first linkage rod, a second linkage rod, an elastic contraction element, at least one activate member, and a thin film circuit unit. The base includes a plurality of first connection portions and a plurality of second connection portions. The cap is movable between a released position and a pressed position. The first linkage rod has a first top section, a first bottom-left section, and a first bottom-right section. The first bottom-left section and the first bottom-right section are movably connected to one of the plurality of first connection portions. The first top section is movably connected to the cap. The second linkage rod has a second top section, a second bottom-left section, and a second bottom-right section. The second bottom-left section and the second bottom-right section are movably connected to one of the plurality of second connection portions. The second top section is movably connected to the cap. One end of the elastic contraction element is connected to the first linkage rod and the other end of the elastic contraction element is connected to the second linkage rod, so as to drive the first top section and the second top section to move close to each other. The activate member is disposed on one of the first linkage rod, the second linkage rod and the cap. The thin film circuit unit includes an activate portion. When the cap is located at the released position and the first linkage rod and the second linkage rod are in a first spatial attitude, the activate member is separate from the activate portion and the thin film circuit unit outputs a first electrical signal. When the cap is located at the pressed position and the first linkage rod and the second linkage rod are in a second spatial attitude, the activate member triggers the activate portion, and the thin film circuit unit outputs a second electrical signal different from the first electrical signal.

In one embodiment, the first linkage rod and the second linkage rod are U-shaped, one end of the elastic contraction element is connected to the first top section, and the other end of the elastic contraction element is connected to the second top section.

In one embodiment, the base is located between the thin film circuit unit and the cap, the first top section includes a top abutting portion, and the base includes a base abutting portion and a base opening. When the first linkage rod is in the second spatial attitude, the top abutting portion abuts against the base abutting portion, and the at least one activate member passes through the base opening to press the activate portion.

In one embodiment, the first linkage rod includes a protruding shaft, the first connection portion includes a connection slot, the protruding shaft is rotatable in the connection slot, and the connection slot has an inner surface and a protruding portion formed therein. When the first linkage rod moves from the first spatial attitude to a transitional spatial attitude, the protruding shaft rotates on the inner surface along a first side of the protruding portion. When the first linkage rod moves from the transitional spatial attitude to the second spatial attitude, the protruding shaft moves across the protruding portion to provide a resistance force to the first linkage rod. When the first linkage rod moves to the second spatial attitude, the protruding shaft slides to abut against a second side of the protruding portion. The first side is opposite to the second side.

In one embodiment, a cross-section of the protruding shaft is substantially in a rectangular shape, and the connection slot includes a first concave portion and a second concave portion. When the first linkage rod is in the first spatial attitude, the protruding shaft abuts against the first concave portion. When the first linkage rod is in the second spatial attitude, the protruding shaft extends into the second concave portion to abut against the protruding portion.

In one embodiment, the base further includes a protruding pillar, and the first linkage rod includes an elastic bent portion and a connection portion. One end of the elastic bent portion is connected to the first linkage rod. The other end of the elastic bent portion is connected to the connection portion. The connection portion includes an opening. The protruding pillar passes through the opening. When the first linkage rod moves from the first spatial attitude to the transitional spatial attitude, the protruding pillar does not abut against an inner edge of the opening. When the first linkage rod moves from the transitional spatial attitude to the second spatial attitude, the protruding pillar abuts against the inner edge of the opening to deform the elastic bent portion for providing a resistance force to the first linkage rod.

In one embodiment, the elastic bent portion has an S-shaped structure. When the first linkage rod is in the first spatial attitude, a first angle is included between a long axis of the S-shaped structure and a long axis of the first linkage rod. When the elastic bent portion is deformed, a second angle is included between the long axis of the S-shaped structure and the long axis of the first linkage rod.

In one embodiment, the elastic contraction element is a tension spring. When the first linkage rod is in the first spatial attitude, the elastic contraction element extends in a horizontal direction. When the first linkage rod is in the second spatial attitude, the elastic contraction element pulls the second linkage rod and still extends in the horizontal direction.

In one embodiment, the key switch further includes a first balance lever and a second balance lever. The first balance lever and the second balance lever are substantially U-shaped and have a first lever opening and a second lever opening respectively. The first linkage rod and the second linkage rod have a first rod opening and a second rod opening respectively. The base further includes a plurality of third connection portions. The first balance lever and the second balance lever are pivoted to the plurality of third connection portions and abut against the cap. A facing direction of the first lever opening is perpendicular to a facing direction of the first rod opening, and a facing direction of the second lever opening is perpendicular to a facing direction of the second rod opening.

In another embodiment, the present invention further provides a key switch. The key switch includes a base, a cap, a first linkage rod, a second linkage rod, an elastic contraction element, at least one light-path switching member, and an optical switch circuit unit. The base includes a plurality of first connection portions and a plurality of second connection portions. The cap is movable between a released position and a pressed position. The first linkage rod has a first top section, a first bottom-left section, and a first bottom-right section. The first bottom-left section and the first bottom-right section are movably connected to one of the plurality of first connection portions. The first top section is movably connected to the cap. The second linkage rod has a second top section, a second bottom-left section, and a second bottom-right section. The second bottom-left section and the second bottom-right section are movably connected to one of the plurality of second connection portions. The second top section is movably connected to the cap. The elastic contraction element is connected to the first linkage rod and the second linkage rod for driving the first top section and the second top section to move close to each other. The light-path switching member is disposed on one of the first linkage rod, the second linkage rod and the cap. The optical switch circuit unit includes a light emitter and a light receiver. A modulation space is formed between the light emitter and the light receiver. The light emitter emits an optical signal toward the light receiver. When the cap is located at the released position and the first linkage rod and the second linkage rod are in a first spatial attitude, the light-path switching member and the modulation space have a first spatial relationship, and the optical signal received by the light receiver has a first intensity. When the cap is located at the pressed position and the first linkage rod and the second linkage rod are in a second spatial attitude, the light-path switching member and the modulation space lose the first spatial relationship, and the optical signal received by the light receiver has a second intensity different from the first intensity.

In summary, since the present invention utilizes the thin film circuit unit or the optical switch circuit unit to provide electrical signals, the present invention can efficiently reduce the overall volume of the key switch. Furthermore, since the present invention can just utilize the protruding portion of the base or the elastic bent portion of the linkage rod to provide a tactile feedback to the key switch, which means there is no need to additionally dispose other component in the key switch, the present invention can further reduce the overall size and the manufacturing and assembly costs of the key switch.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
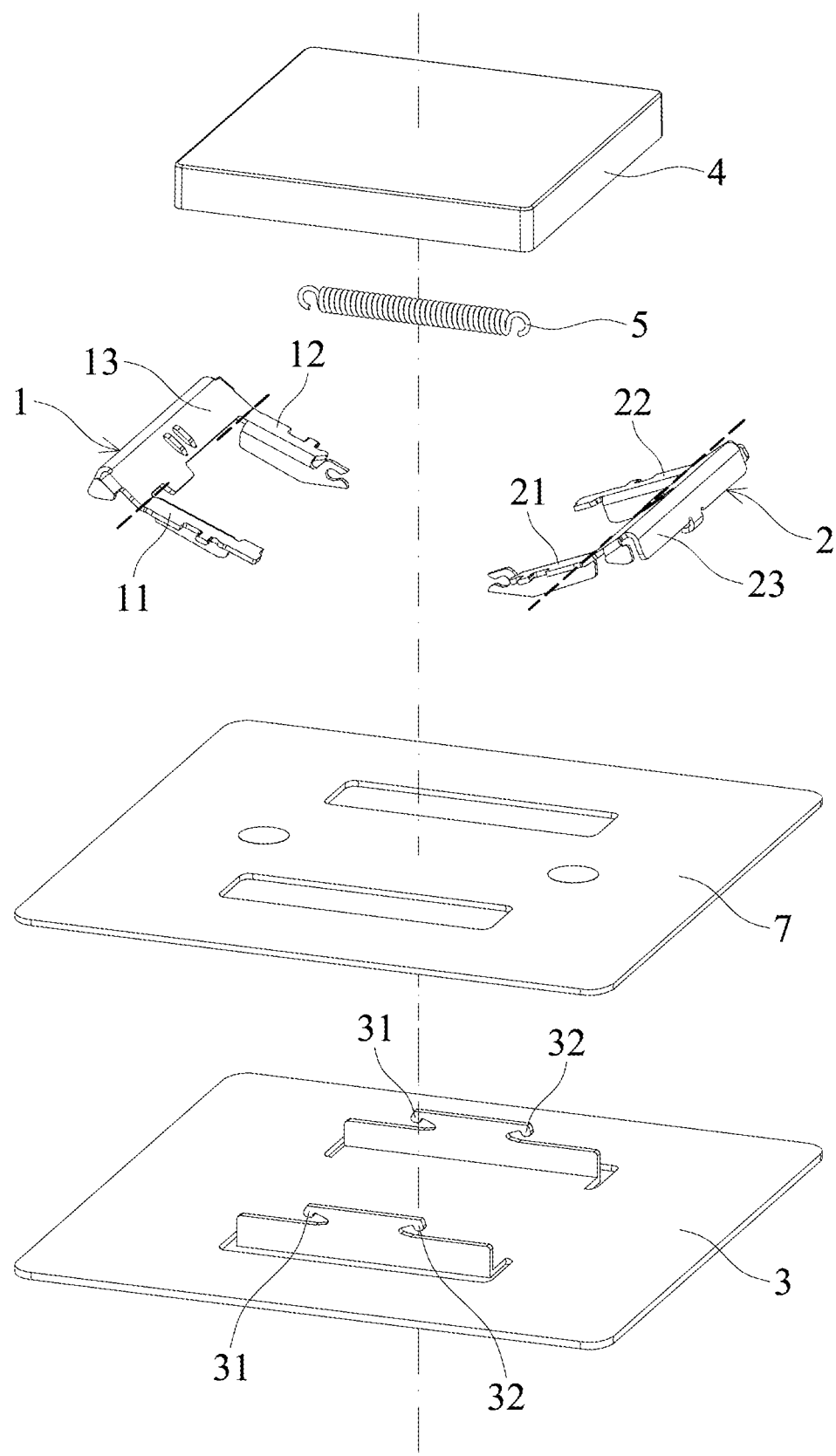
FIG. 1A is an exploded diagram of a key switch according to a first embodiment of the present invention.
Figure 1B:
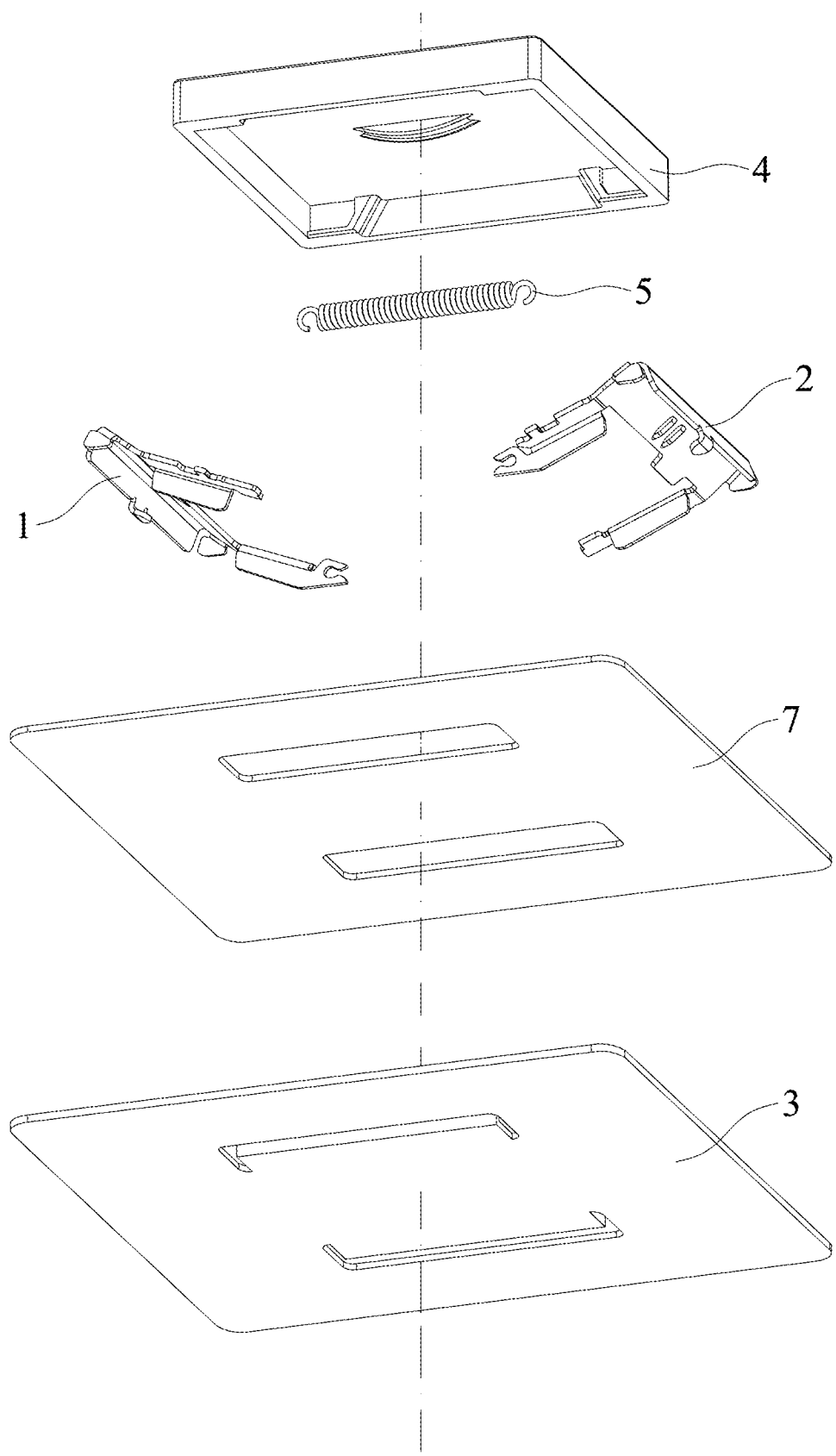
FIG. 1B is an exploded diagram of the key switch in FIG. 1A from another viewing angle.
Figure 1C:
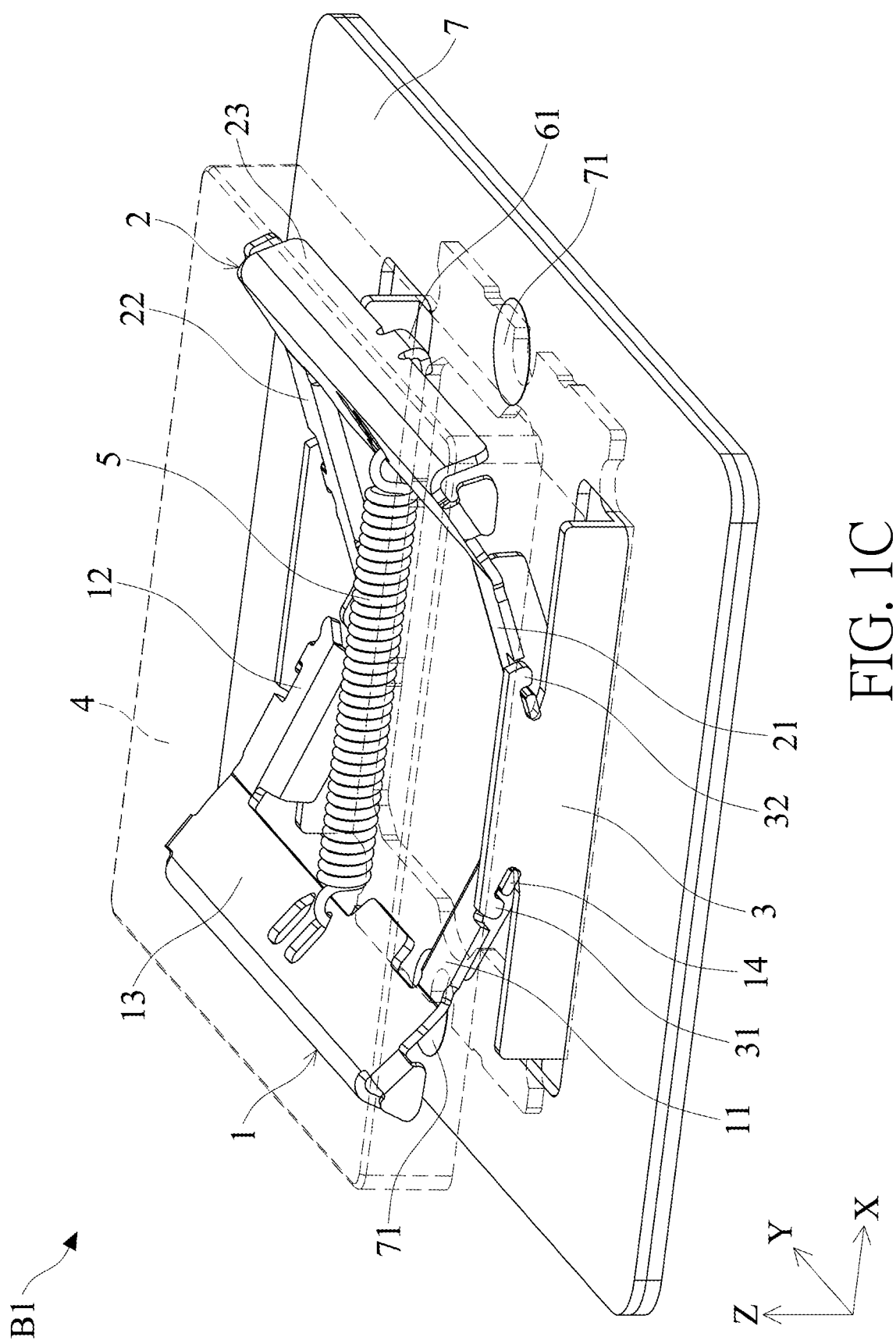
FIG. 1C is an assembly diagram of the key switch according to the first embodiment of the present invention, wherein a first linkage rod and a second linkage rod are in a first spatial attitude.
Figure 1D:
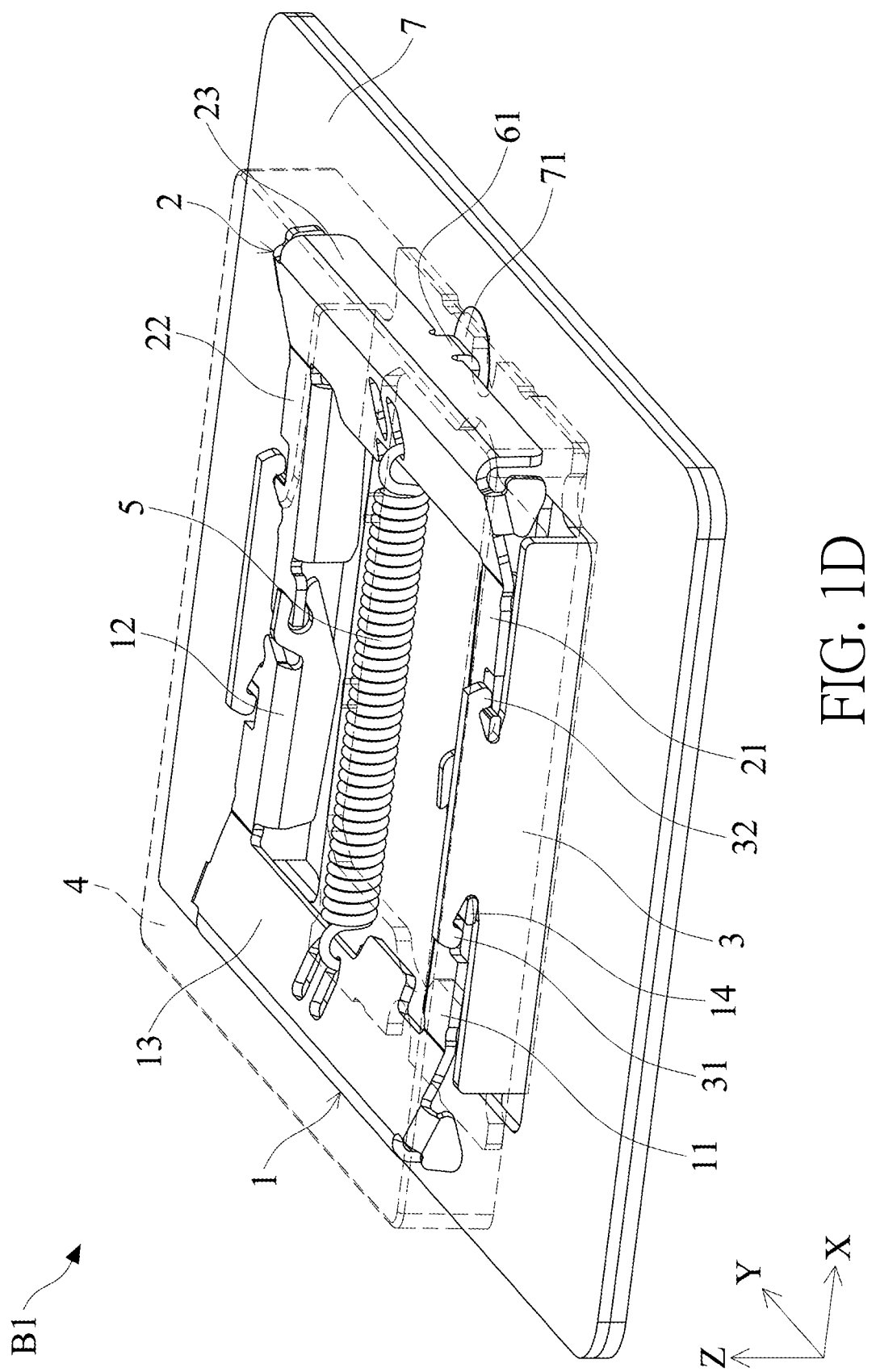
FIG. 1D is an assembly diagram of the key switch according to the first embodiment of the present invention, wherein the first linkage rod and the second linkage rod are in a second spatial attitude.

FIG. 1A is an exploded diagram of a key switch according to a first embodiment of the present invention. FIG. 1B is an exploded diagram of the key switch in FIG. 1A from another viewing angle. FIGS. 1C and 1D are assembly diagrams of the key switch B1 in FIG. 1. As shown in FIGS. 1A, 1B, 1C, and 1D, the key switch B1 includes a base 3, a cap 4, a first linkage rod 1, a second linkage rod 2, an elastic contraction element 5, at least one activate member 61, and a thin film circuit unit 7. The base 3 includes a plurality of first connection portions 31 and a plurality of second connection portions 32. The cap 4 is movable between a released position as shown in FIG. 1C and a pressed position as shown in FIG. 1D. The first linkage rod 1 has a first top section 13, a first bottom-left section 11, and a first bottom-right section 12. The first bottom-left section 11 and the first bottom-right section 12 are connected to one of the plurality of first connection portions 31 respectively in a movable manner, and the first top section 13 is movably connected to the cap 4. The second linkage rod 2 has a second top section 23, a second bottom-left section 21, and a second bottom-right section 22. The second bottom-left section 21 and the second bottom-right section 22 are connected to one of the plurality of second connection portions 32 respectively in a movable manner, and the second top section 23 is movably connected to the cap 4. One end of the elastic contraction element 5 is connected to the first linkage rod 1 and the other end of the elastic contraction element 5 is connected to the second linkage rod 2, so as to drive the first top section 13 and the second top section 23 to move close to each other. The activate member 61 is selectively disposed on one of the first linkage rod 1, the second linkage rod 2 and the cap 4. The thin film circuit unit 7 includes at least one activate portion 71. As shown in FIG. 1C, when the cap 4 is located at the released position and the first linkage rod 1 and the second linkage rod 2 are in a first spatial attitude, the activate member 61 is separate from the activate portion 71, and the thin film circuit unit 7 outputs a first electrical signal. As shown in FIG. 1D, when the cap 4 is located at the pressed position and the first linkage rod 1 and the second linkage rod 2 are in a second spatial attitude, the activate member 61 pressed the activate portion 71, and the thin film circuit unit 7 outputs a second electrical signal.

As shown in FIG. 1C and FIG. 1D, in one embodiment, the first linkage rod 1 and the second linkage rod 2 could be U-shaped, one end of the elastic contraction element 5 is connected to the first top section 13, and the other end of the elastic contraction element 5 is connected to the second top section 23.

In one embodiment of the present invention, the thin film circuit unit is located between the base and the cap. However, the aforesaid disclosure does not limit the present invention. For example, in another embodiment, the base could be located between the thin film circuit unit and the cap, the first top section of the first linkage rod could include a top abutting portion, and the base could include a base abutting portion and a base opening. When the first linkage rod is in the second spatial attitude, the top abutting portion abuts against the base abutting portion, and the activate member passes through the base opening to press the activate portion.

Figure 1E:
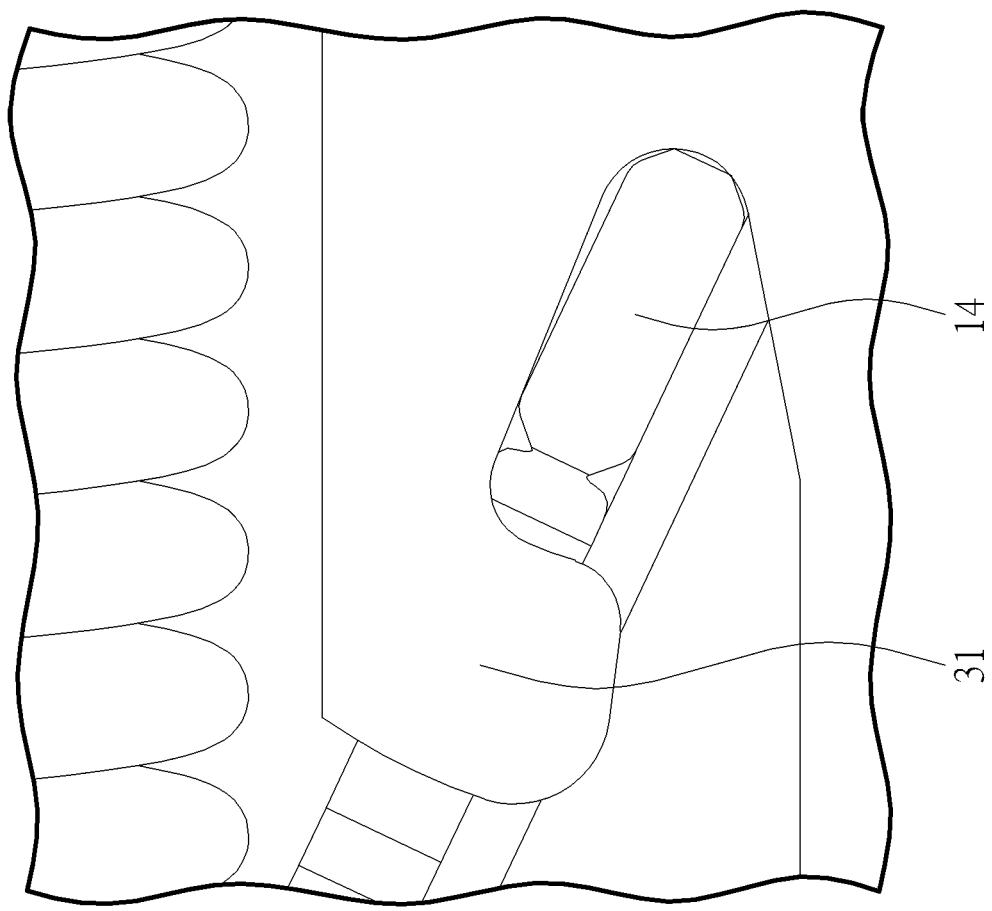
FIG. 1E shows connection of a protruding shaft and a connection portion according to the first embodiment of the present invention, wherein the first linkage rod and the second linkage rod are in the first spatial attitude.
Figure 1F:
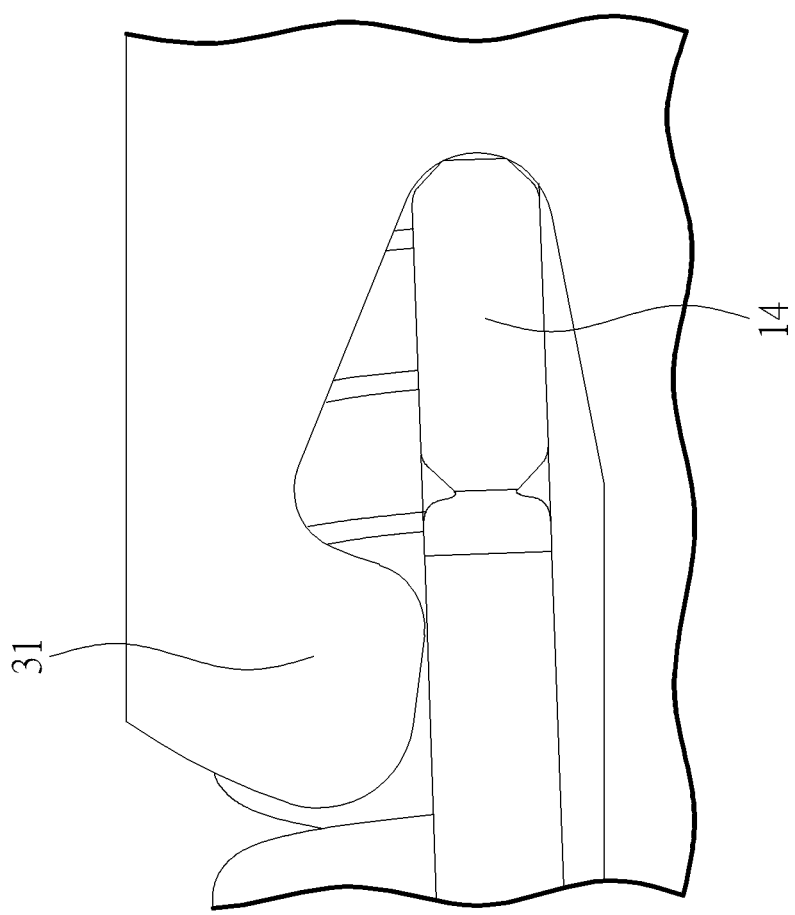
FIG. 1F shows connection of the protruding shaft and the connection portion according to the first embodiment of the present invention, wherein the first linkage rod and the second linkage rod are in the second spatial attitude.

FIG. 1E shows connection of a protruding shaft 14 and the connection portion 31 according to the first embodiment of the present invention, wherein the first linkage rod and the second linkage rod are in the first spatial attitude. FIG. 1F shows connection of the protruding shaft 14 and the connection portion 31 according to the first embodiment of the present invention, wherein the first linkage rod and the second linkage rod are in the second spatial attitude.

Figure 2A:
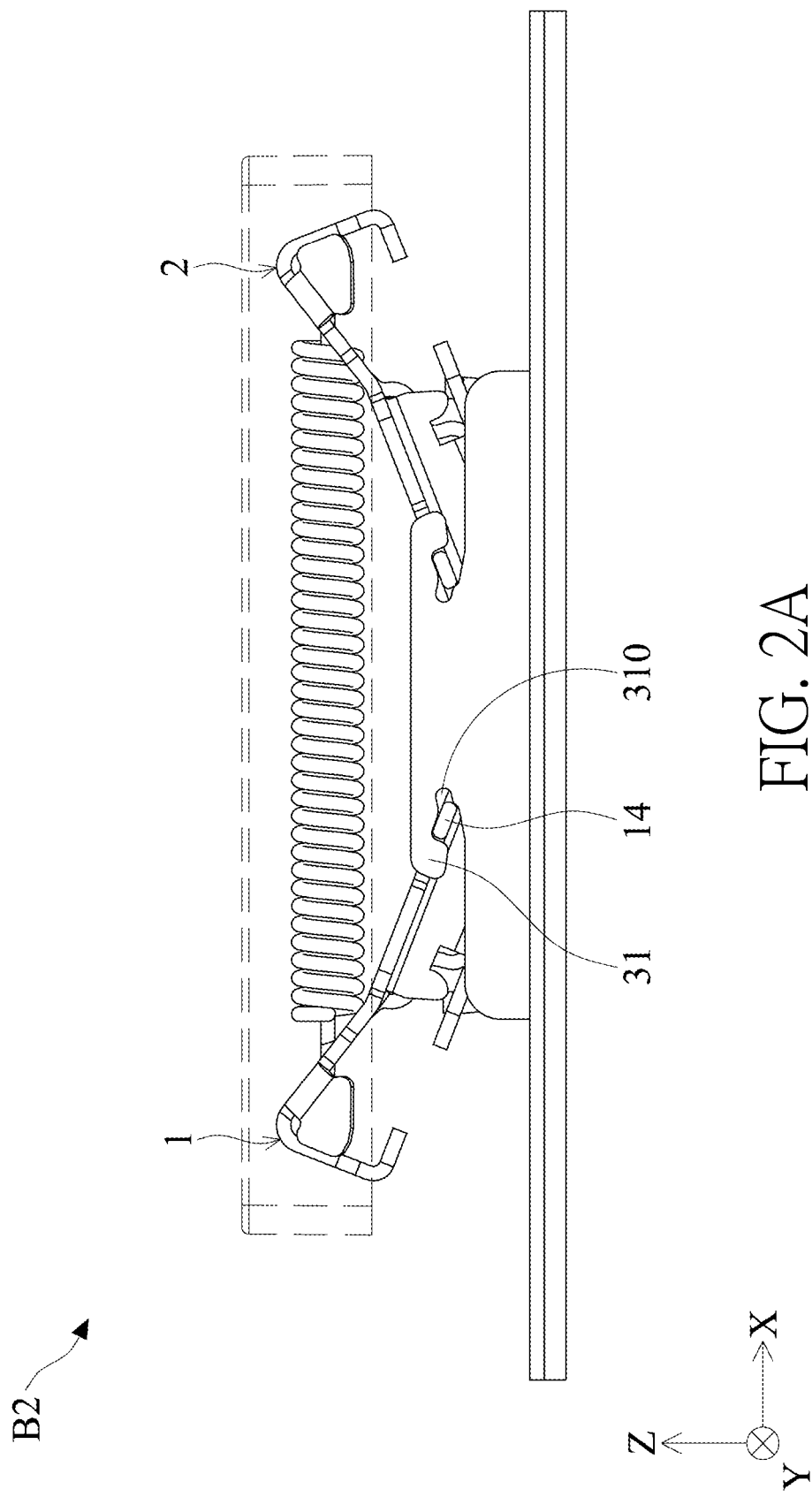
FIG. 2A is a diagram of a key switch according to a second embodiment of the present invention, wherein the first linkage rod and the second linkage rod are in the first spatial attitude.
Figure 2B:
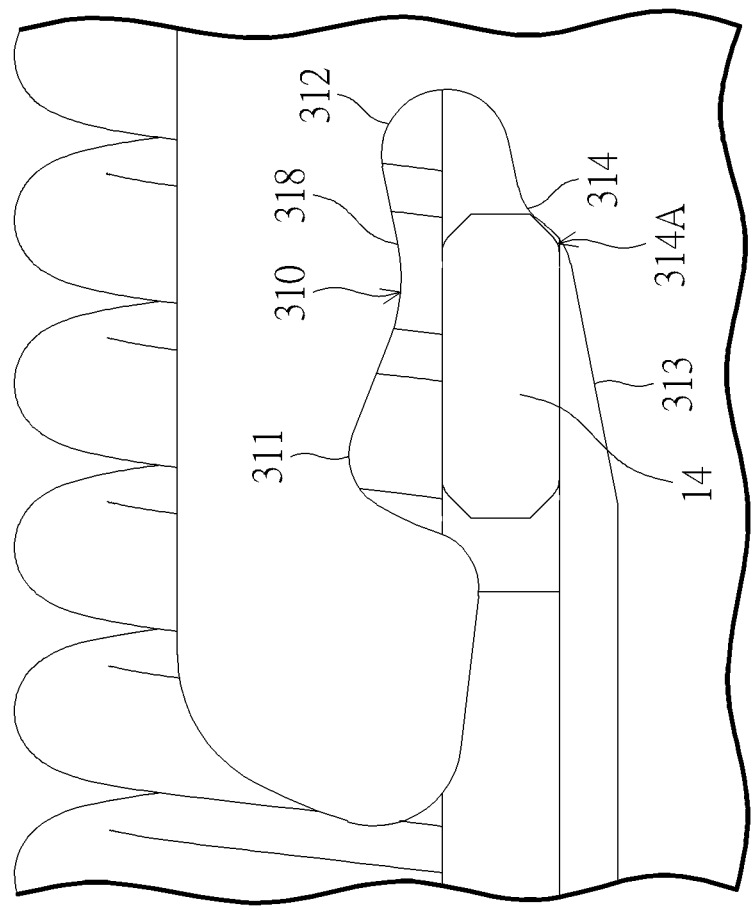
FIG. 2B is a diagram of the key switch according to the second embodiment of the present invention, wherein the first linkage rod and the second linkage rod are in a transitional spatial attitude.
Figure 2C:
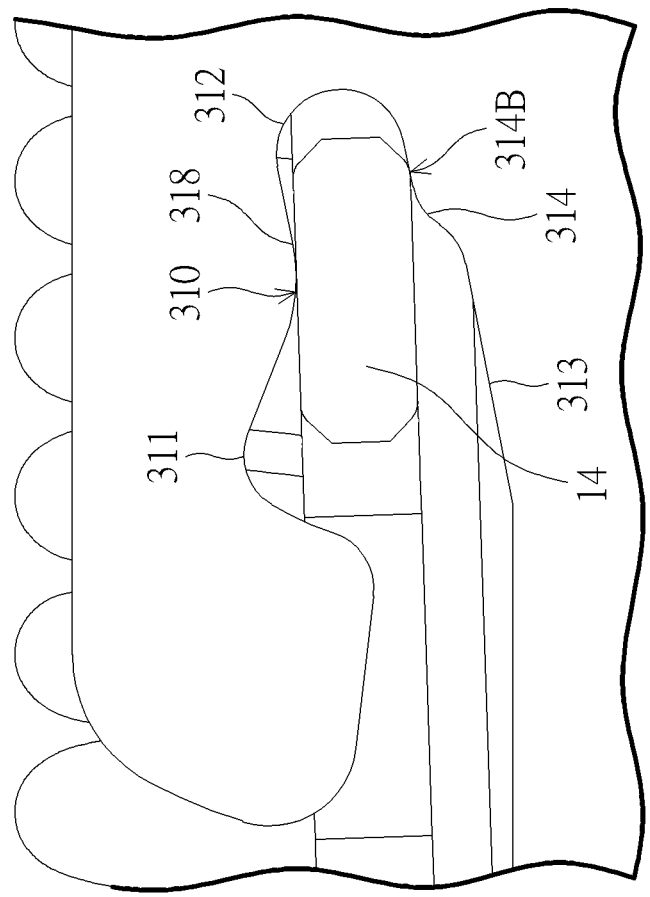
FIG. 2C is a diagram of the key switch according to the second embodiment of the present invention, wherein the first linkage rod and the second linkage rod are in the second spatial attitude.

FIGS. 2A, 2B, and 2C show a key switch B2 according to a second embodiment of the present invention. As shown in FIGS. 2A, 2B, and 2C, the first linkage rod 1 includes the protruding shaft 14, the first connection portion 31 includes a connection slot 310. The protruding shaft 14 is rotatable in the connection slot 310. The connection slot 310 has an inner surface 313 and a protruding portion 314 formed therein. The protruding portion 314 has a first side 314A and a second side 314B opposite to each other and located at a top end of the protruding portion 314. The inner surface 313 is connected to the first side 314A of the protruding portion 314. When the cap 4 moves from the released position to the pressed position, the first linkage rod 1 moves from the first spatial attitude as shown in FIG. 2A to a transitional spatial attitude as shown in FIG. 2B, and the protruding shaft 14 rotates and slides on the inner surface 313 at this stage. Subsequently, the first linkage rod 1 moves from the transitional spatial attitude as shown in FIG. 2B to the second spatial attitude as shown in FIG. 2C. At this stage, the protruding shaft 14 moves across the top end of the protruding portion 314 and then slides to the second side 314B of the protruding portion 314, so that the protruding portion 314 can exert force upon the protruding shaft to provide a resistance force to the first linkage rod 1. Accordingly, the resistance force can provide a tactile feedback to a user when the key switch B2 is triggered. The tactile feedback can generate the force feedback effect when the user's finger presses the key switch B2 and then the rubber dome collapse occurs.

As shown FIGS. 2A, 2B, and 2C, in one embodiment, a cross-section of the protruding shaft 14 is substantially in a rectangular shape, and the connection slot 310 has an inner top surface 319. The inner top surface 319 includes a first concave portion 311, an arc-shaped convex portion 318 and a second concave portion 312. When the first linkage rod 1 is in the first spatial attitude as shown in FIG. 2A, the protruding shaft 14 abuts against the first concave portion 311. When the first linkage rod 1 is in the second spatial attitude as shown in FIG. 2C, the protruding shaft 14 extends into the second concave portion 312. During the process of the first linkage rod 1 moving from the first spatial attitude as shown in FIG. 2A to the second spatial attitude as shown in FIG. 2C, a left end of the protruding shaft 14 abuts against the first concave portion 311, and then a top surface of the protruding shaft 14 slides along the arc-shaped convex portion 318. Finally, a right end of the protruding shaft 14 extends into the second convex portion 312. In such a manner, the present invention can generate the smooth rotation effect.

Figure 3A:
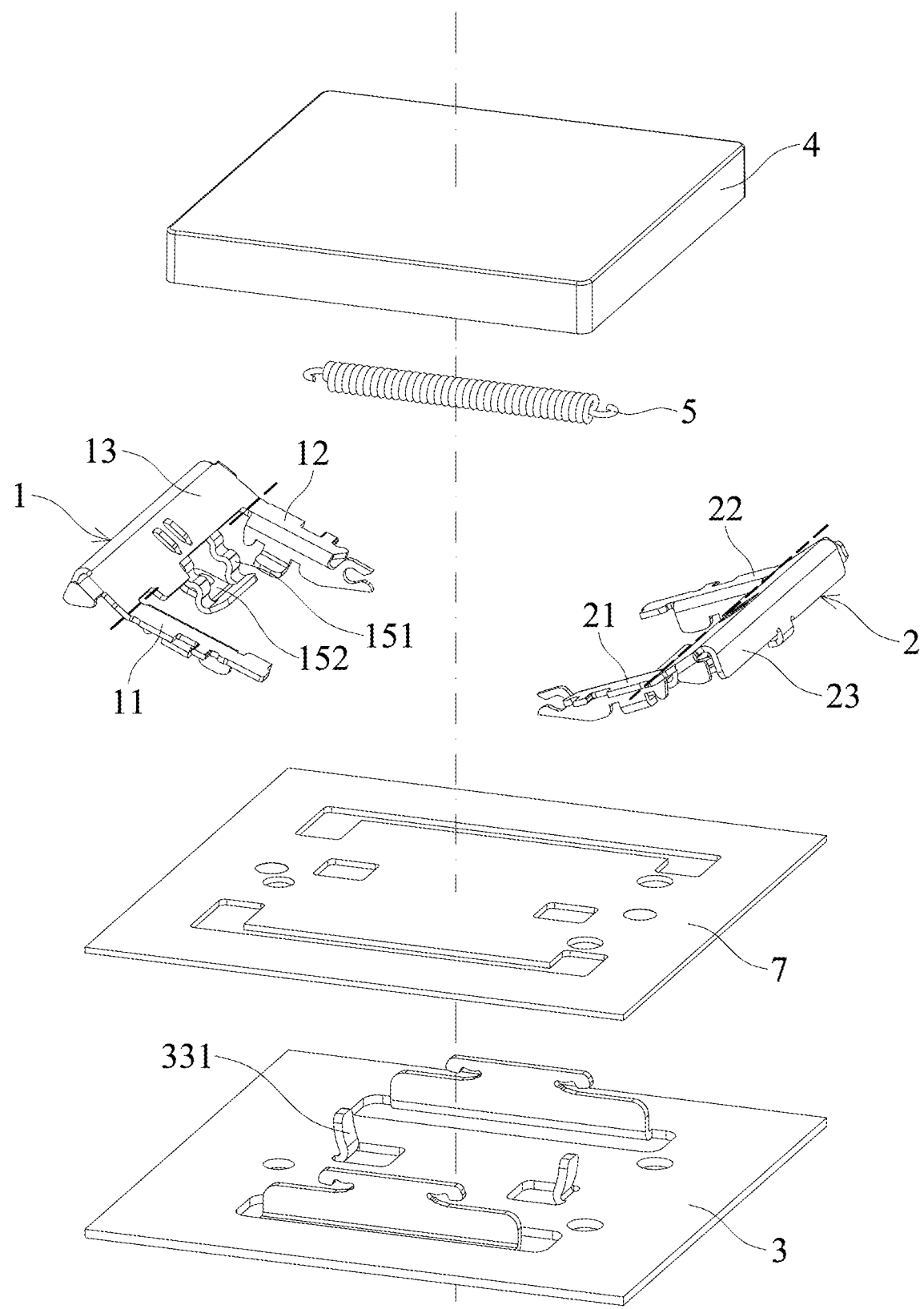
FIG. 3A is an exploded diagram of a key switch according to a third embodiment of the present invention.
Figure 3B:
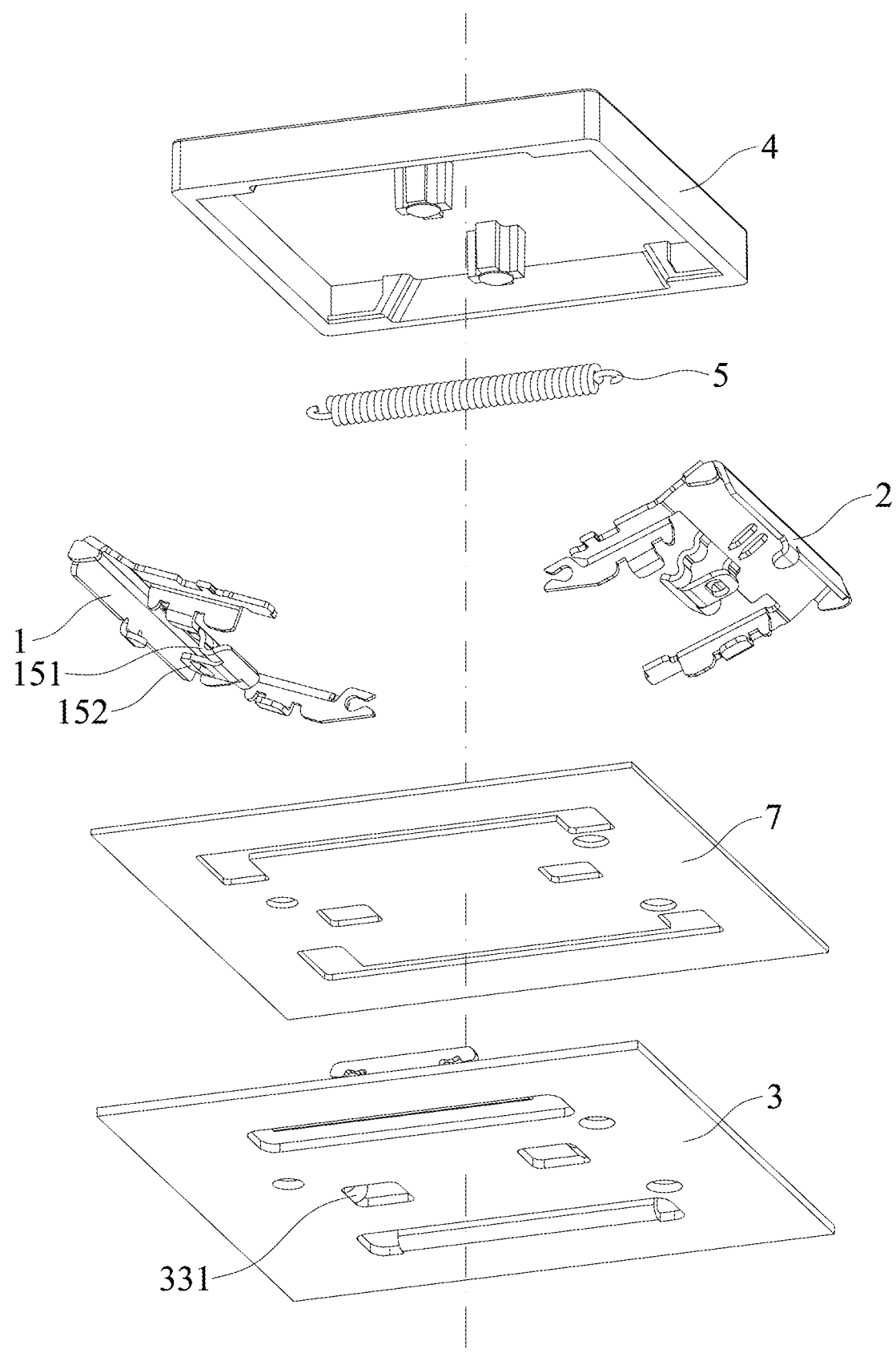
FIG. 3B is an exploded diagram of the key switch in FIG. 3A from another viewing angle.
Figure 3C:
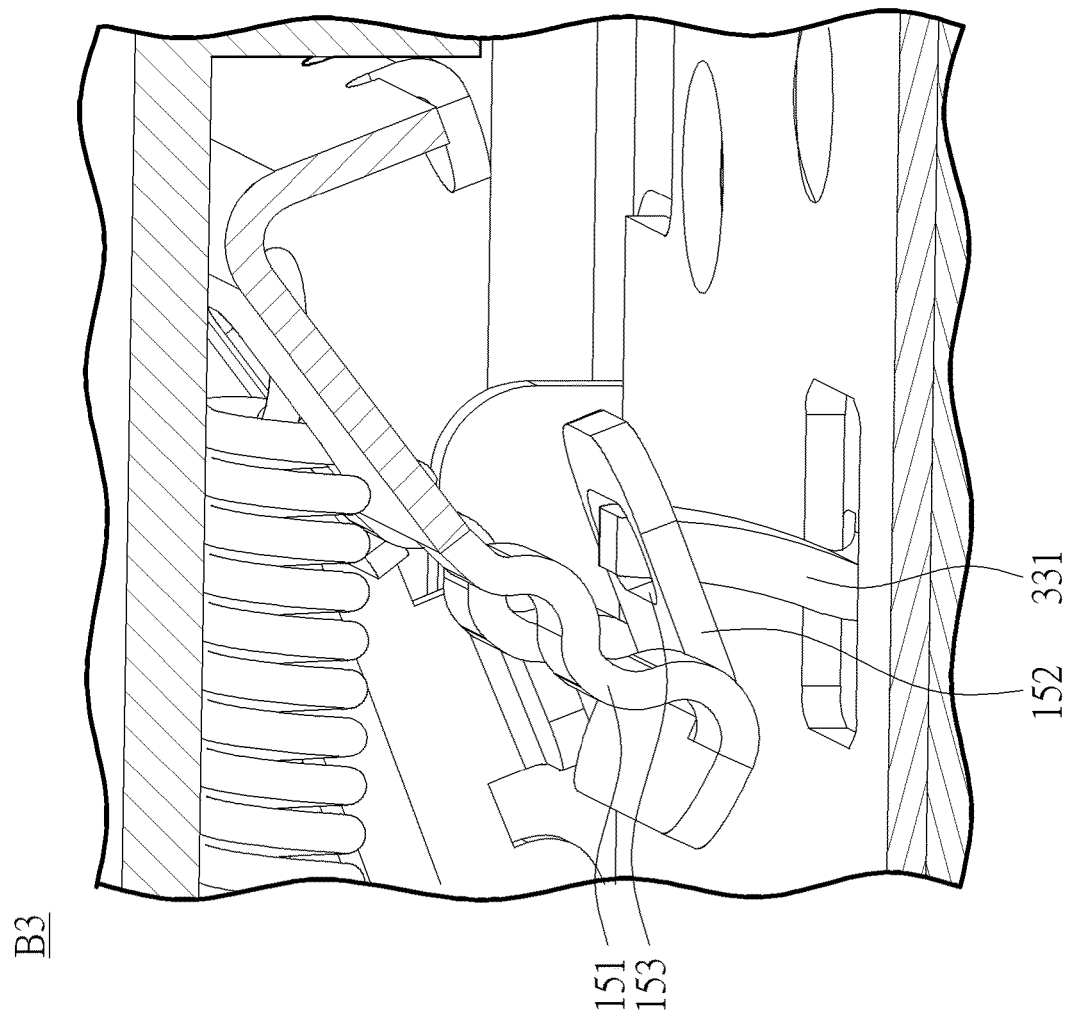
FIG. 3C shows the key switch according to the third embodiment of the present invention, wherein the first linkage rod and the second linkage rod are in the first spatial attitude.
Figure 3D:
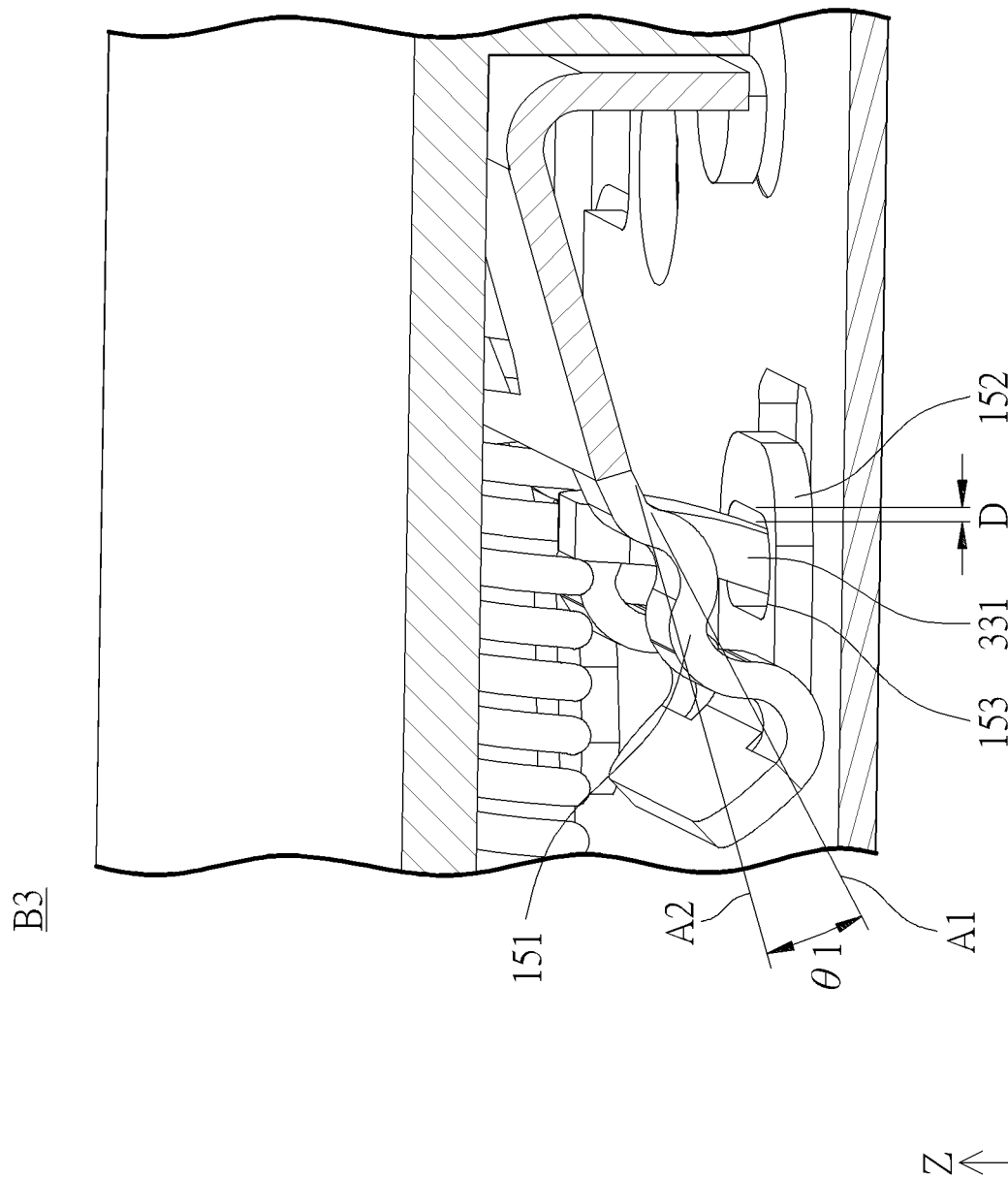
FIG. 3D shows the key switch according to the third embodiment of the present invention, wherein the first linkage rod and the second linkage rod are in the transitional spatial attitude.
Figure 3E:
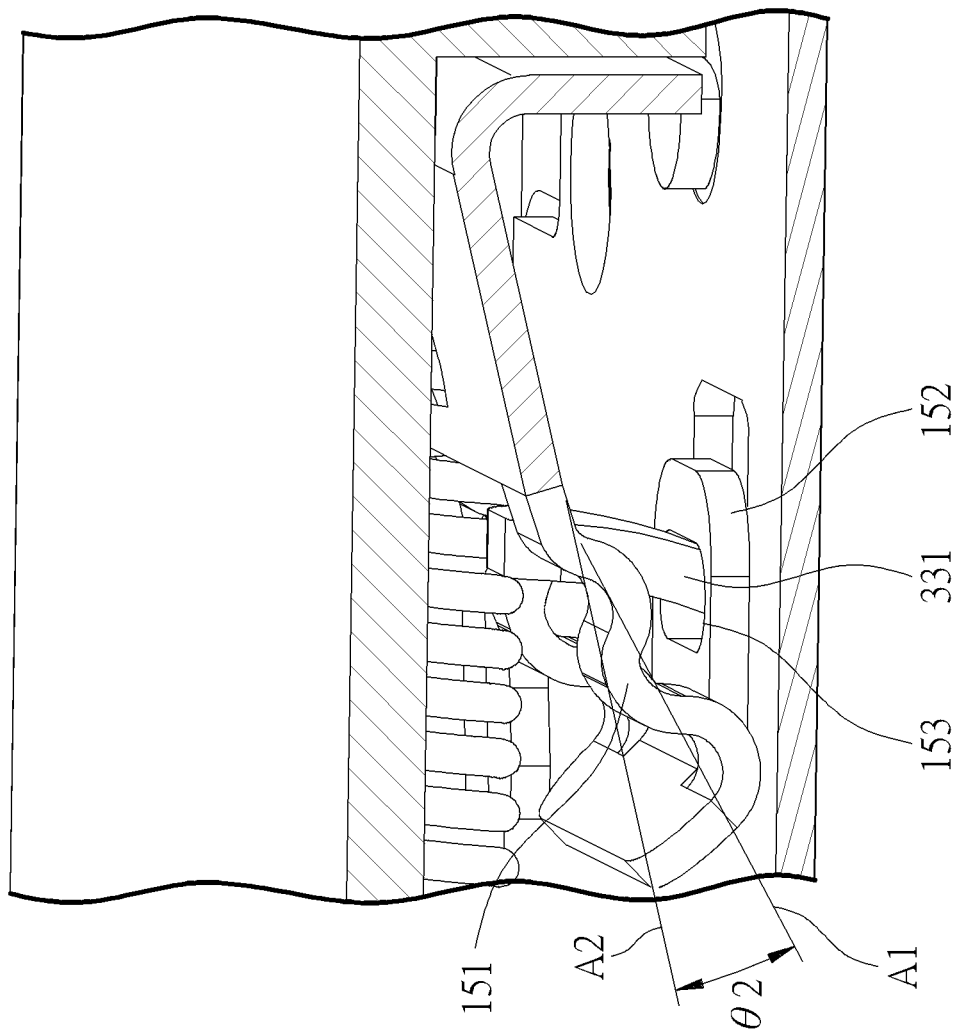
FIG. 3E shows the key switch according to the third embodiment of the present invention, wherein the first linkage rod and the second linkage rod are in the second spatial attitude.

FIG. 3A is an exploded diagram of a key switch according to a third embodiment of the present invention. FIG. 3B is an exploded diagram of the key switch in FIG. 3A from another viewing angle. FIG. 3C shows the key switch according to the third embodiment of the present invention, wherein the first linkage rod and the second linkage rod are in the first spatial attitude. FIG. 3D shows the key switch according to the third embodiment of the present invention, wherein the first linkage rod and the second linkage rod are in the transitional spatial attitude. FIG. 3E shows the key switch according to the third embodiment of the present invention, wherein the first linkage rod and the second linkage rod are in the second spatial attitude. As shown in FIGS. 3A, 3B, 3C, 3D, and 3E, in this embodiment, the base 3 further includes a protruding pillar 331, and the first linkage rod 1 includes an elastic bent portion 151 and a connection portion 152. One end of the elastic bent portion 151 is connected to the first linkage rod 1, and the other end of the elastic bent portion 151 is connected to the connection portion 152. The connection portion 152 includes an opening 153. The protruding pillar 331 passes through the opening 153. When the cap 4 moves from the released position to the pressed position, there are three movement stages: (1) the first linkage rod 1 is located in the first spatial attitude as shown in FIG. 3C, and the protruding pillar 311 is away from an inner edge of the opening 153; (2) the first linkage rod 1 has moved from the first spatial attitude as shown in FIG. 3C to the transitional spatial attitude as shown in FIG. 3D, the protruding pillar 331 has not abutted against the inner edge of the opening 153 yet, and there is a distance D between the protruding pillar 331 and the inner edge of the opening 153; (3) the first linkage rod 1 moves from the transitional spatial attitude as shown in FIG. 3D to the second spatial attitude as shown in FIG. 3E, and the protruding pillar 331 abuts against the inner edge of the opening 153 and pulls the elastic bent portion 151 to cause deformation of the elastic bent portion 151, so as to provide a resistance force to the first linkage rod 1. Accordingly, the resistance force can provide a tactile feedback to the user when the key switch is triggered.

As shown in FIGS. 3C, 3D, and 3E, in one embodiment, the elastic bent portion 151 has an S-shaped structure. When the first linkage rod 1 is in the first spatial attitude, a first angle θ1 is formed between a long axis A1 of the S-shaped structure and a long axis A2 of the first linkage rod 1. When the elastic bent portion 151 is deformed, a second angle θ2 is formed between the long axis A1 of the S-shaped structure and the long axis A2 of the first linkage rod 1 and is different from the first angle θ1.

In the aforesaid embodiment, the elastic contraction element 5 is a tension spring. When the first linkage rod 1 or the second linkage rod 2 is in the first spatial attitude, the elastic contraction element 5 extends in a horizontal direction. At this time, since bottom ends of the first linkage rod 1 and the second linkage rod 2 are engaged with each other to form a linkage mechanism, the first linkage rod 1 can move downward with the second linkage rod 2 when one of the first linkage rod 1 and the second linkage rod 2 is pressed. Thus, the elastic contraction element 5 can still extend in the horizontal direction even when the first linkage rod 1 or the second linkage rod 2 is in the second spatial attitude.

Figure 4:
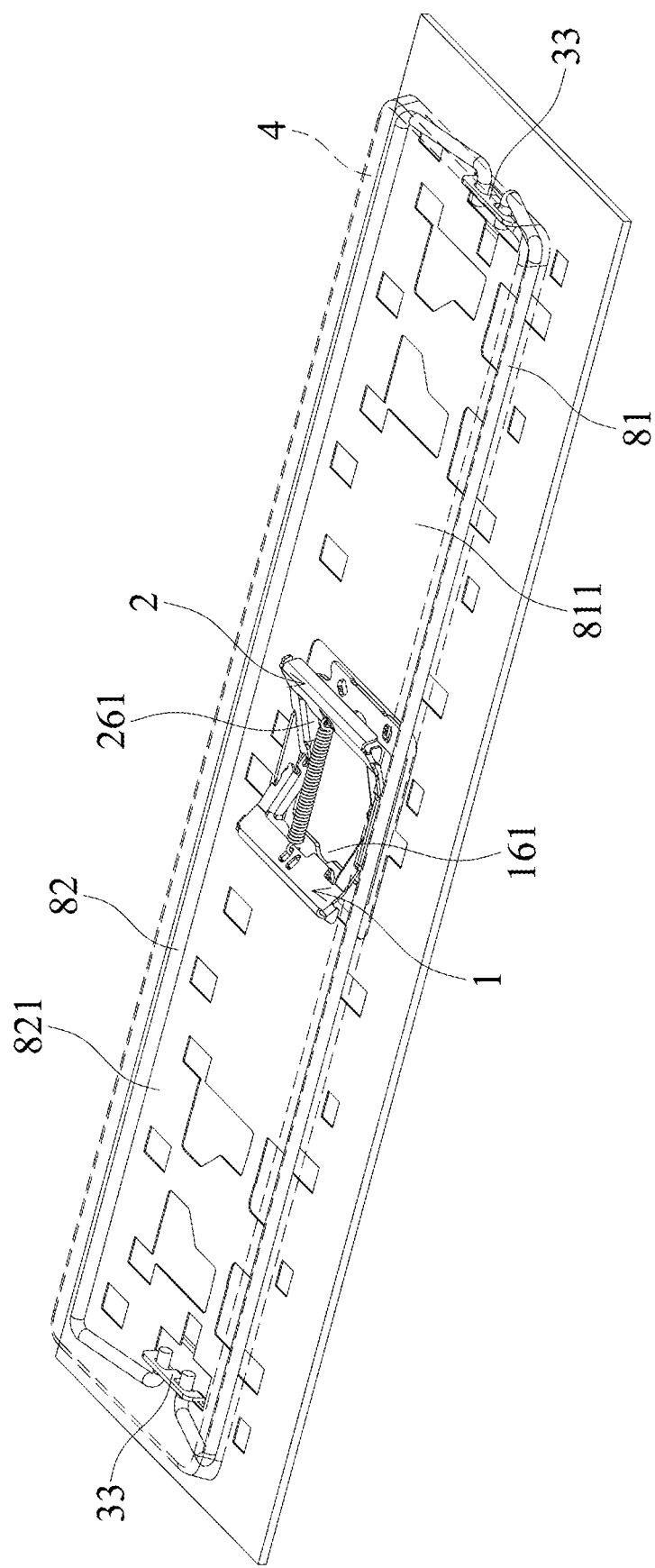
FIG. 4 shows a derived embodiment of the present invention.

As shown in FIG. 4, in one embodiment, the key switch further includes a first balance lever 81 and a second balance lever 82. The first balance lever 81 and the second balance lever 82 are substantially U-shaped. The first balance lever 81 and the second balance lever 82 have a first lever opening 811 and a second lever opening 821 respectively. The first linkage rod 1 and the second linkage rod 2 have a first rod opening 161 and a second rod opening 261 respectively. The base 3 further includes a plurality of third connection portions 33. The first balance lever 81 and the second balance lever 82 are pivoted to the plurality of third connection portions 33 and abut against the cap 4. A facing direction of the first lever opening 811 is perpendicular to a facing direction of the first rod opening 161, and a facing direction of the second lever opening 821 is perpendicular to a facing direction of the second rod opening 261.

Figure 5A:
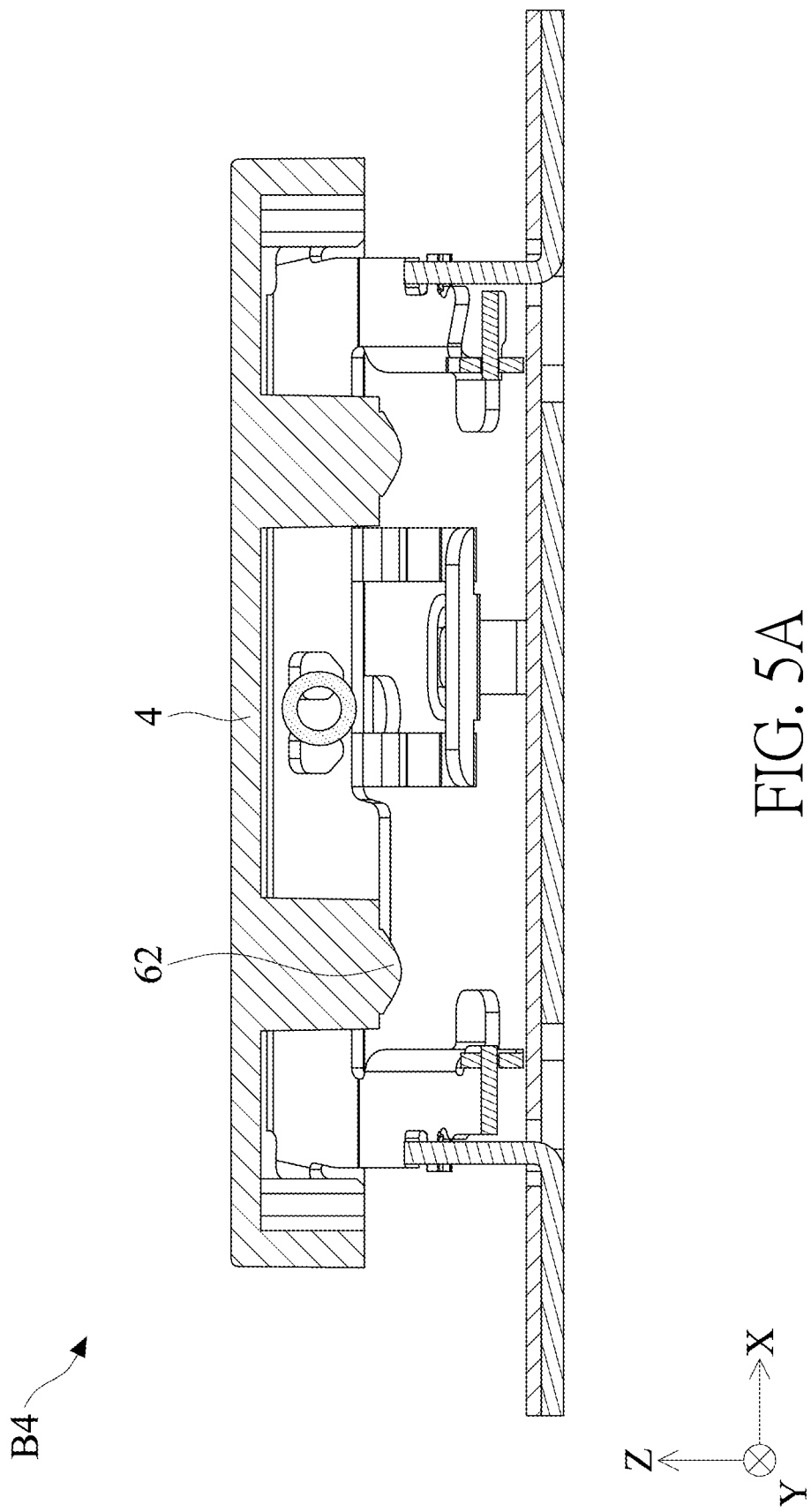
FIGS. 5A and 5B show a key switch according to a fourth embodiment of the present invention.
Figure 5B:
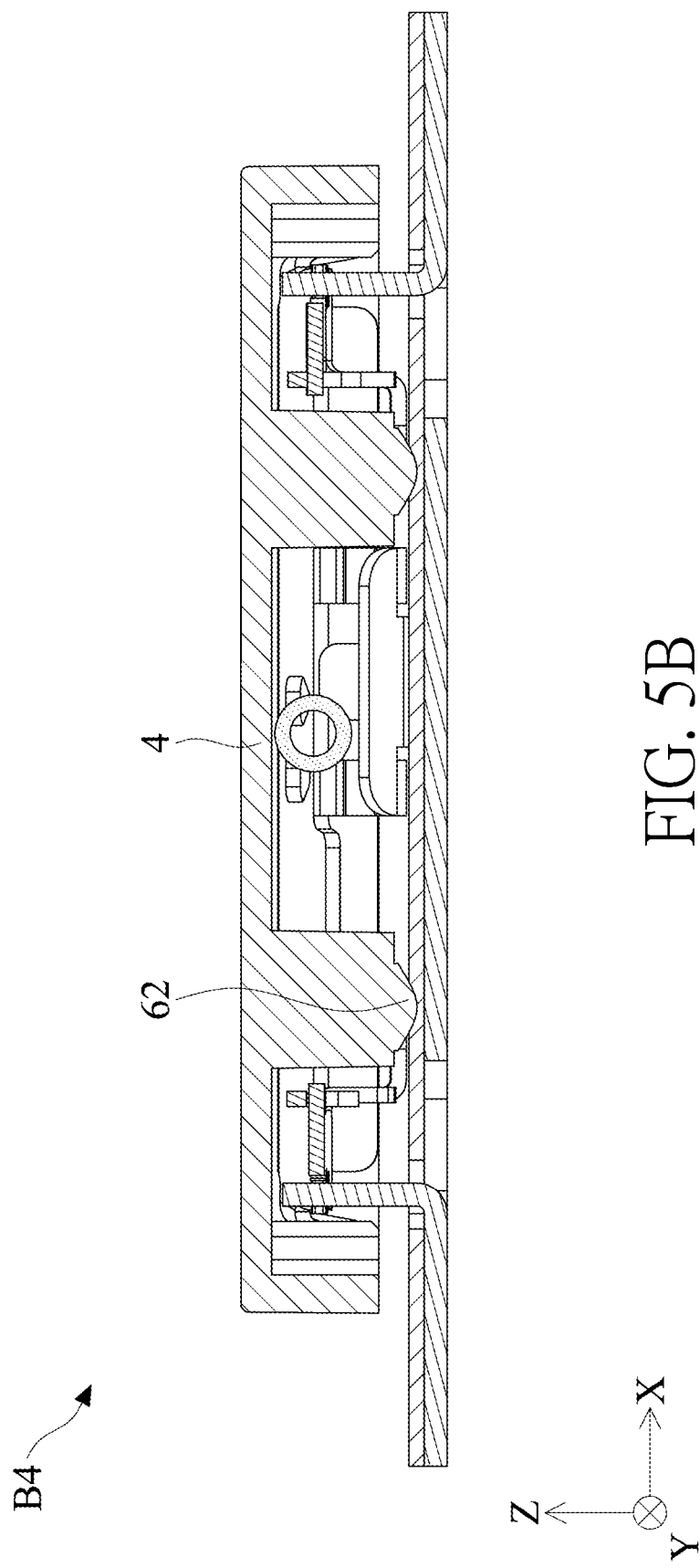
Figure 6A:
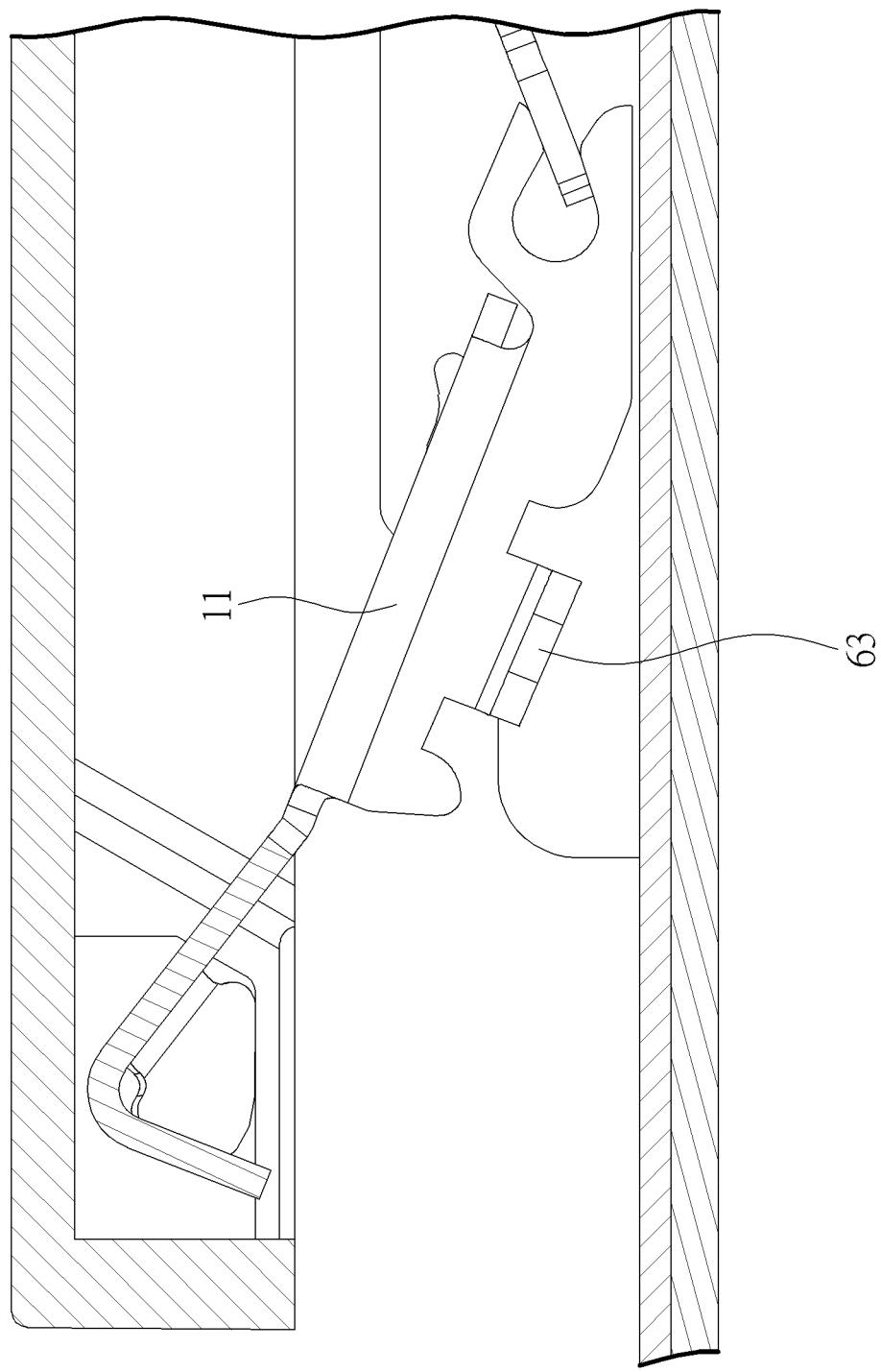
FIGS. 6A and 6B show a key switch according to a fifth embodiment of the present invention.
Figure 6B:
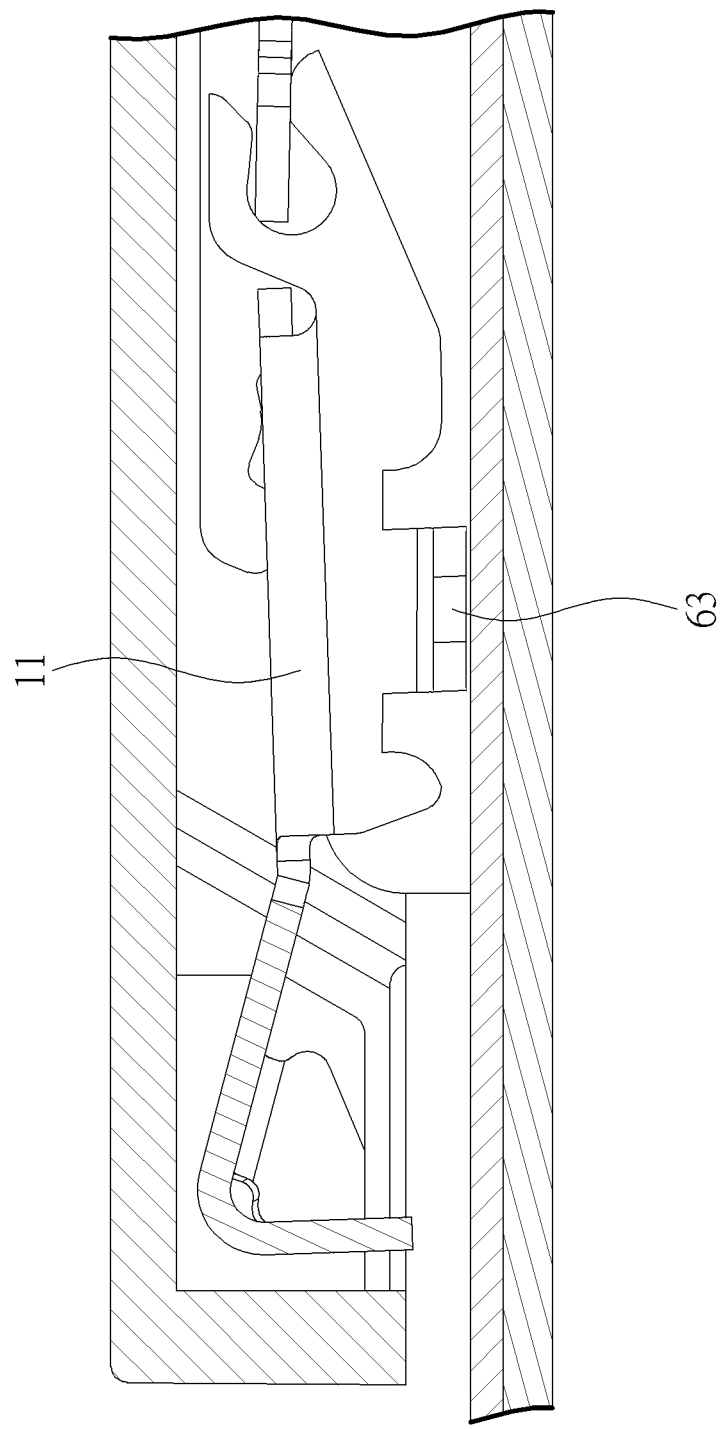

FIGS. 5A and 5B show a key switch B4 according to a fourth embodiment of the present invention. An activate member 62 is disposed on the cap 4 for providing a triggering function. FIGS. 6A and 6B show a key switch B5 according to a fifth embodiment of the present invention. An activate member 63 is disposed on the first bottom-left section 11 or the first bottom-right section 12 for providing a triggering function.

Figure 7:
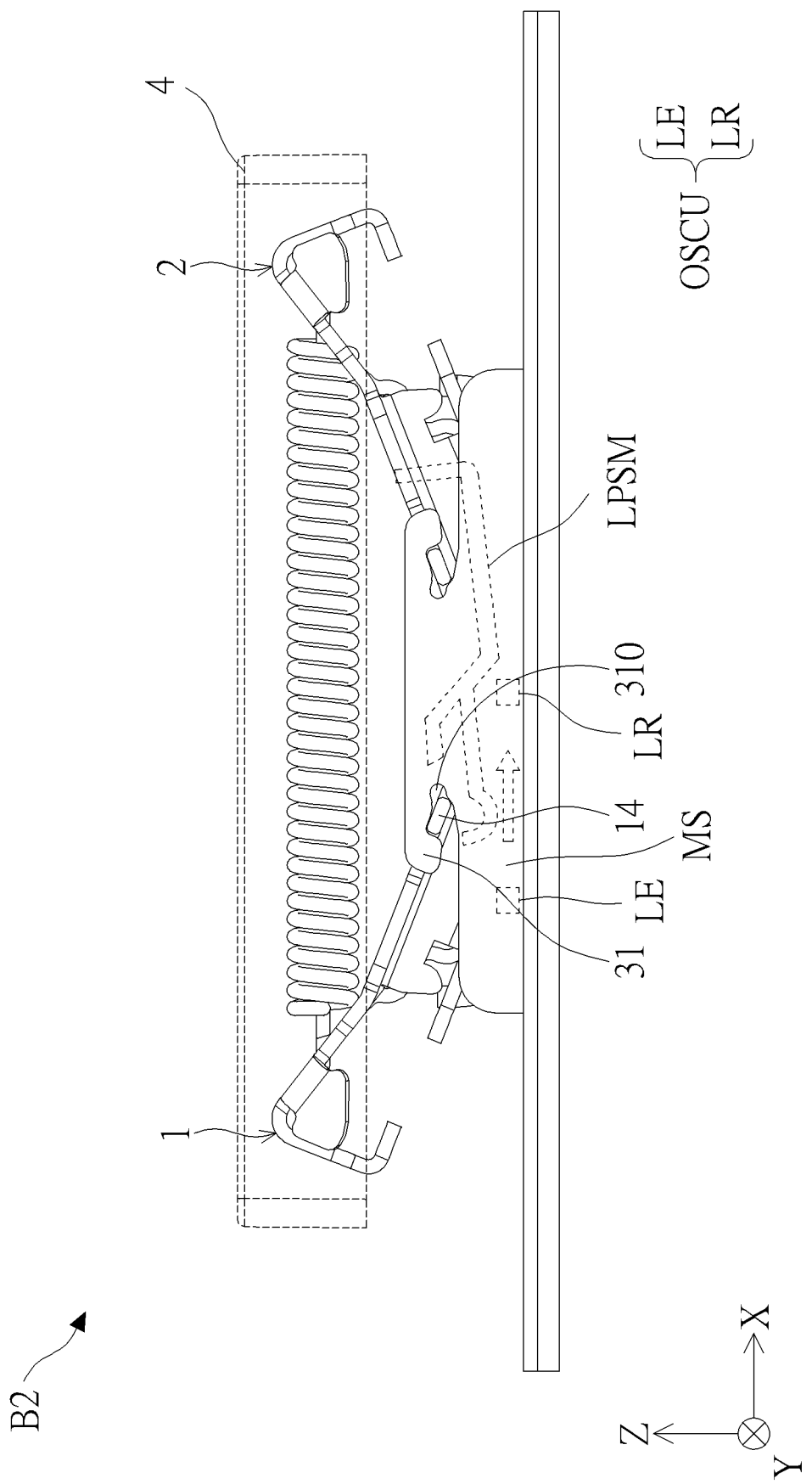
FIG. 7 is a diagram of a key switch according to another embodiment of the present invention.

In another embodiment shown in FIG. 7, the present invention further provides a key switch B2, wherein the activate member and the thin film circuit unit are replaced with at least one light-path switching member LPSM and an optical switch circuit unit OSCU respectively. As for the detailed description for the optical switch principle, it could be reasoned by analogy according to Taiwan patent No. 1662572 or Chinese patent No. CN108962654A, which discloses the related design for light-path switching members (e.g. a tactile resilient member 270 in FIG. 31A of CN108962654A) and optical switch circuit units (e.g. a light emitter 234 and a light receiver 236 in FIG. 31A of CN108962654A). In one embodiment, the light-path switching member LPSM is disposed on one of the first linkage rod 1 the second linkage rod 2, and the cap 4, and the optical switch circuit unit OSCU includes a light emitter LE and a light receiver LR. A modulation space MS is formed between the light emitter LR and the light receiver LE. The light emitter LE is used for emitting an optical signal toward the light receiver LR. When the cap 4 is located at the released position and the first linkage rod 1 and the second linkage rod 2 are in a first spatial attitude, the light-path switching member LPSM and the modulation space MS have a first spatial relationship, and the optical signal received by the light receiver LR has a first intensity. When the cap 4 is located at the pressed position and the first linkage rod 1 and the second linkage rod 2 are in a second spatial attitude, the light-path switching member LPSM and the modulation space MS lose the first spatial relationship, and the optical signal received by the light receiver LR has a second intensity different from the first intensity.

In summary, since the present invention utilizes the thin film circuit unit or the optical switch circuit unit to provide electrical signals, the present invention can efficiently reduce the overall volume of the key switch. Furthermore, since the present invention can just utilize the protruding portion of the base or the elastic bent portion of the linkage rod to provide the tactile feedback to the key switch, which means there is no need to additionally dispose other component in the key switch, the present invention can further reduce the overall size and the manufacturing and assembly costs of the key switch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A key switch comprising:
   a base comprising a plurality of first connection portions and a plurality of second connection portions;
   a cap movable between a released position and a pressed position;
   a first linkage rod having a first top section, a first bottom-left section, and a first bottom-right section, the first bottom-left section and the first bottom-right section being movably connected to one of the plurality of first connection portions, the first top section being movably connected to the cap;
   a second linkage rod having a second top section, a second bottom-left section, and a second bottom-right section, the second bottom-left section and the second bottom-right section being movably connected to one of the plurality of second connection portions, the second top section being movably connected to the cap;
   an elastic contraction element connected to the first linkage rod and the second linkage rod for driving the first top section and the second top section to move close to each other;
   at least one activate member disposed on one of the first linkage rod, the second linkage rod and the cap; and
   a thin film circuit unit comprising an activate portion;
   wherein when the cap is located at the released position and the first linkage rod and the second linkage rod are in a first spatial attitude, the at least one activate member is separate from the activate portion and the thin film circuit unit outputs a first electrical signal;

when the cap is located at the pressed position and the first linkage rod and the second linkage rod are in a second spatial attitude, the at least one activate member triggers the activate portion, and the thin film circuit unit outputs a second electrical signal different from the first electrical signal.

2. The key switch of claim 1, wherein the first linkage rod and the second linkage rod are U-shaped, one end of the elastic contraction element is connected to the first top section, and the other end of the elastic contraction element is connected to the second top section.

3. The key switch of claim 2, wherein the base is located between the thin film circuit unit and the cap.

4. The key switch of claim 2, wherein the first linkage rod comprises a protruding shaft, the first connection portion comprises a connection slot, the protruding shaft is rotatable in the connection slot, and the connection slot has an inner surface and a protruding portion formed therein; when the first linkage rod moves from the first spatial attitude to a transitional spatial attitude, the protruding shaft rotates on the inner surface along a first side of the protruding portion; when the first linkage rod moves from the transitional spatial attitude to the second spatial attitude, the protruding shaft moves across the protruding portion to provide a resistance force to the first linkage rod; when the first linkage rod moves to the second spatial attitude, the protruding shaft slides to abut against a second side of the protruding portion; the first side is opposite to the second side.

5. The key switch of claim 4, wherein a cross-section of the protruding shaft is substantially in a rectangular shape, and the connection slot comprises a first concave portion and a second concave portion; when the first linkage rod is in the first spatial attitude, the protruding shaft abuts against the first concave portion; when the first linkage rod is in the second spatial attitude, the protruding shaft extends into the second concave portion to abut against the protruding portion.

6. The key switch of claim 2, wherein the base further comprises a protruding pillar, the first linkage rod comprises an elastic bent portion and a connection portion, one end of the elastic bent portion is connected to the first linkage rod, another end of the elastic bent portion is connected to the connection portion, the connection portion comprises an opening, and the protruding pillar passes through the opening; when the first linkage rod moves from the first spatial attitude to a transitional spatial attitude, the protruding pillar does not abut against an inner edge of the opening; when the first linkage rod moves from the transitional spatial attitude to the second spatial attitude, the protruding pillar abuts against the inner edge of the opening to deform the elastic bent portion for providing a resistance force to the first linkage rod.

7. The key switch of claim 6, wherein the elastic bent portion has an S-shaped structure; when the first linkage rod is in the first spatial attitude, a first angle is included between a long axis of the S-shaped structure and a long axis of the first linkage rod; when the elastic bent portion is deformed, a second angle is included between the long axis of the S-shaped structure and the long axis of the first linkage rod.

8. The key switch of claim 2, wherein the elastic contraction element is a tension spring; when the first linkage rod is in the first spatial attitude, the elastic contraction element extends in a horizontal direction; when the first linkage rod is in the second spatial attitude, the elastic contraction element pulls the second linkage rod and still extends in the horizontal direction.

9. The key switch of claim 2, wherein the key switch further comprises a first balance lever and a second balance lever, the first balance lever and the second balance lever are substantially U-shaped and have a first lever opening and a second lever opening respectively, the first linkage rod and the second linkage rod have a first rod opening and a second rod opening respectively, the base further comprises a plurality of third connection portions, the first balance lever and the second balance lever are pivoted to the plurality of third connection portions and abut against the cap, a facing direction of the first lever opening is perpendicular to a facing direction of the first rod opening, and a facing direction of the second lever opening is perpendicular to a facing direction of the second rod opening.

10. A key switch comprising:
a base comprising a plurality of first connection portions and a plurality of second connection portions;
a cap movable between a released position and a pressed position;
a first linkage rod having a first top section, a first bottom-left section, and a first bottom-right section, the first bottom-left section and the first bottom-right section being movably connected to one of the plurality of first connection portions, the first top section being movably connected to the cap;
a second linkage rod having a second top section, a second bottom-left section, and a second bottom-right section, the second bottom-left section and the second bottom-right section being movably connected to one of the plurality of second connection portions, the second top section being movably connected to the cap;
an elastic contraction element connected to the first linkage rod and the second linkage rod for driving the first top section and the second top section to move close to each other;
at least one light-path switching member disposed on one of the first linkage rod, the second linkage rod and the cap; and
an optical switch circuit unit comprises a light emitter and a light receiver, a modulation space being formed between the light emitter and the light receiver, the light emitter emitting an optical signal toward the light receiver;
wherein when the cap is located at the released position and the first linkage rod and the second linkage rod are in a first spatial attitude, the at least one light-path switching member and the modulation space have a first spatial relationship, and the optical signal received by the light receiver has a first intensity;
when the cap is located at the pressed position and the first linkage rod and the second linkage rod are in a second spatial attitude, the at least one light-path switching member and the modulation space lose the first spatial relationship, and the optical signal received by the light receiver has a second intensity different from the first intensity.

11. The key switch of claim 10, wherein the first linkage rod and the second linkage rod are U-shaped, one end of the elastic contraction element is connected to the first top section, and the other end of the elastic contraction element is connected to the second top section.

12. The key switch of claim 11, wherein the first linkage rod comprises a protruding shaft, the first connection portion comprises a connection slot, the protruding shaft is rotatable in the connection slot, and the connection slot has an inner surface and a protruding portion formed therein; when the first linkage rod moves from the first spatial attitude to a transitional spatial attitude, the protruding shaft rotates on the inner surface along a first side of the protruding portion; when the first linkage rod moves from the transitional spatial attitude to the second spatial attitude, the protruding shaft moves across the protruding portion to provide a resistance force to the first linkage rod; when the first linkage rod moves to the second spatial attitude, the protruding shaft slides to abut against a second side of the protruding portion; the first side is opposite to the second side.

13. The key switch of claim 12, wherein a cross-section of the protruding shaft is substantially in a rectangular shape, the connection slot comprises a first concave portion and a second concave portion; when the first linkage rod is in the first spatial attitude, the protruding shaft abuts against the first concave portion; when the first linkage rod is in the second spatial attitude, the protruding shaft extends into the second concave portion to abut against the protruding portion.

14. The key switch of claim 11, wherein the base further comprises a protruding pillar, the first linkage rod comprises an elastic bent portion and a connection portion, one end of the elastic bent portion is connected to the first linkage rod, another end of the elastic bent portion is connected to the connection portion, the connection portion comprises an opening, and the protruding pillar passes through the opening; when the first linkage rod moves from the first spatial attitude to a transitional spatial attitude, the protruding pillar does not abut against an inner edge of the opening; when the first linkage rod moves from the transitional spatial attitude to the second spatial attitude, the protruding pillar abuts against the inner edge of the opening to deform the elastic bent portion for providing a resistance force to the first linkage rod.

15. The key switch of claim 14, wherein the elastic bent portion has an S-shaped structure; when the first linkage rod is in the first spatial attitude, a first angle is included between a long axis of the S-shaped structure and a long axis of the first linkage rod; when the elastic bent portion is deformed, a second angle is included between the long axis of the S-shaped structure and the long axis of the first linkage rod.

16. The key switch of claim 11, wherein the elastic contraction element is a tension spring; when the first linkage rod is in the first spatial attitude, the elastic contraction element extends in a horizontal direction; when the first linkage rod is in the second spatial attitude, the elastic contraction element pulls the second linkage rod and still extends in the horizontal direction.

17. The key switch of claim 11, wherein the key switch further comprises a first balance lever and a second balance lever, the first balance lever and the second balance lever are substantially U-shaped and have a first lever opening and a second lever opening respectively, the first linkage rod and the second linkage rod have a first rod opening and a second rod opening respectively, the base further comprises a plurality of third connection portions, the first balance lever and the second balance lever are pivoted to the plurality of third connection portions and abut against the cap, a facing direction of the first lever opening is perpendicular to a facing direction of the first rod opening, and a facing direction of the second lever opening is perpendicular to a facing direction of the second rod opening.

* * * * *